June 2, 1970 D. F. FRICK 3,515,341

PULSE RESPONSIVE COUNTERS

Filed Sept. 26, 1966

| PULSE | FLIP-FLOP 110 | 120 | 130 | 140 | C | T |
|---|---|---|---|---|---|---|
| | RESET | RESET | RESET | RESET | | |
| 1 | SET | " | " | " | 130-0 | 110-1 |
| 2 | " | SET | " | " | 130-0 | 120-1 |
| 3 | RESET | " | " | " | 130-0 | 110-0 |
| 4 | " | RESET | SET | " | 130-0 | 120-0 |
| 5 | SET | " | " | " | 130-1 | 110-1 |
| 6 | " | SET | " | " | 130-1 | 120-1 |
| 7 | RESET | " | " | " | 130-1 | 110-0 |
| 8 | " | RESET | " | SET | 130-1 | 120-0 |
| 9 | " | " | RESET | " | 140-1 | 130-0 |
| 0 | " | " | " | RESET | 130-0 | 140-0 |

INVENTOR.
DAVID F. FRICK
BY George W. Killian
AGENT 3,515,341

PULSE RESPONSIVE COUNTERS

David F. Frick, Castro Valley, Calif., assignor, by mesne assignments, to The Singer Company, a corporation of New Jersey Filed Sept. 26, 1966, Ser. No. 581,924
Int. Cl. H03k *21/02, 21/10*
U.S. Cl. 235—92 7 Claims

ABSTRACT OF THE DISCLOSURE

A pulse responsive counter comprising two pairs of flip-flops with each pair responding individually to selected pulses so that each pair of flip-flops counts in accordance with the principles of a Gray code. In accordance with a preferred embodiment, the second pair of flip-flops advances in response to each completion of the first two complete Gray code cycles of the first pair of flip-flops and then in response to the individual pulses succeeding those that drove the first pair. The first pair of flip-flops is not advanced after the two complete Gray code cycles. Output signals from each of said flip-flops are coupled to a plurality of gates which taken together provide an indication of the instantaneous setting of the plurality of flip-flops.

Figures 1, 2:
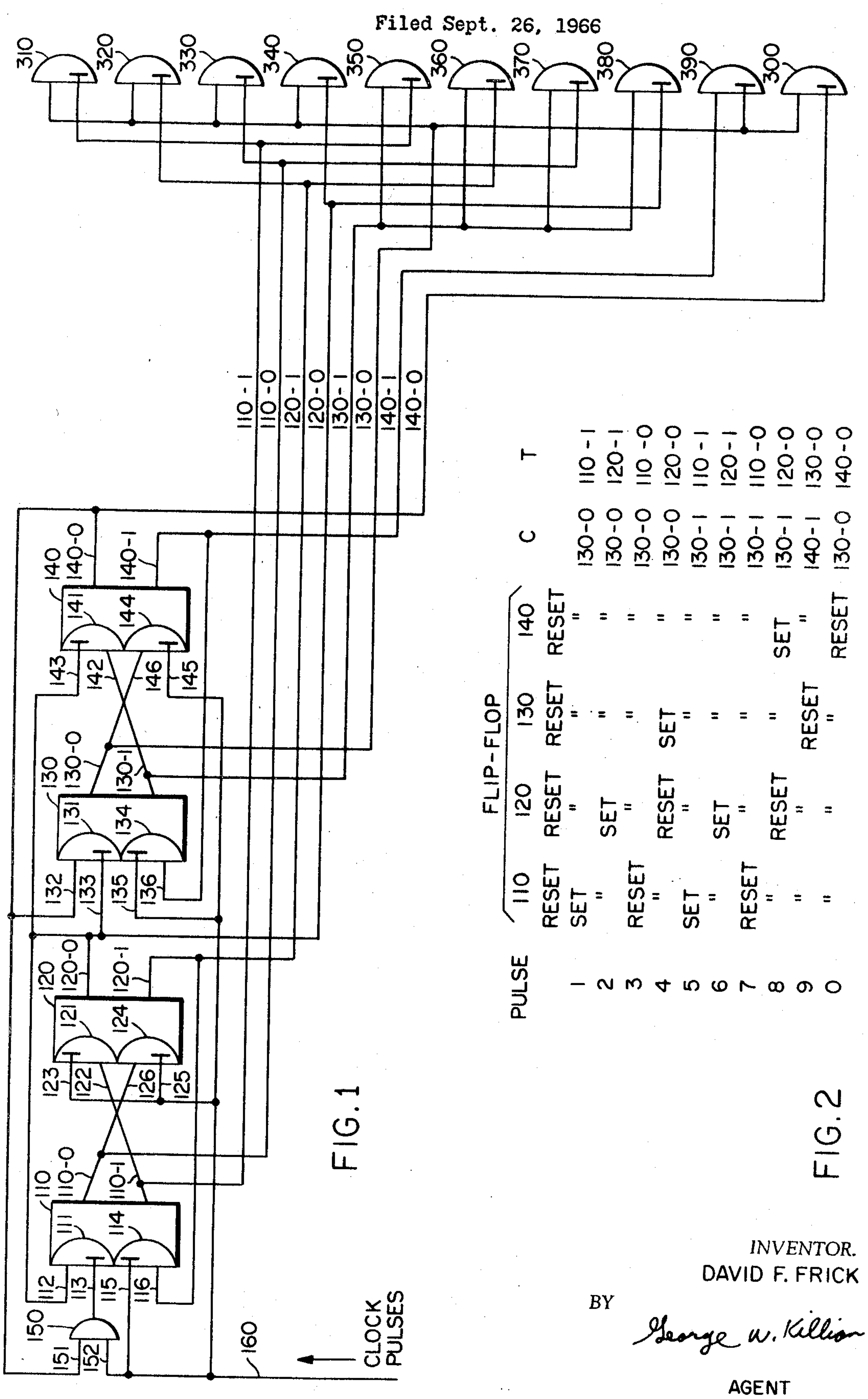

This invention relates to a data processing system and more particularly to an electronic system for converting data in one form to another form.

The use of distributors for the seriatim transmission of data bits from a parallel source; or alternatively for the parallel registration of bits serially received is well known in the communication art and such distributors are widely used in telegraph signaling systems.

Early art distributors were mechanical and/or electro-mechanical. Recently electronic distributors have been introduced to facilitate more rapid conversion and transmission of data and to eliminate the need for adjustment of the mechanical parts thereof.

Typical prior art electronic distributors comprised a counter composed of a plurality of bistable elements, a pulse source, and a plurality of gates which were sequentially enabled. These distributors require a control lead from each bistable element in the counter to each of the plurality of gates. Or expressed differently the gates were required to be equipped with a number of input terminals equal to the number of bistable elements in the counter. A requirement which added to their cost and complexity. The wiring of the numerous gate control leads also increased the cost.

Accordingly, it is the object of this invention to provide a new and improved data conversion system.

Another object is to provide a data conversion system which comprises fewer parts than required heretofore.

Another object is to provide a data conversion system such as an electronic distributor having a minimum number of control leads.

Another object is to provide means for sequentially enabling a plurality of gates with a minimum number of control leads.

Another object is to provide a counter circuit which is capable of providing signals indicative of the current setting of the counter.

In accordance with the present invention there is provided a counter comprising a plurality of bistable elements, a pulse source, and means for coupling said pulse source to said counter elements to advance the count thereof in a manner which permits each setting to be uniquely defined by signals on a minimum number of leads.

Although this invention is amenable to various forms and to various circuit configurations as well as systems requiring different counting capacities the inventive concept will be most readily understood by considering a specific embodiment. When the invention is understood it will be apparent to those skilled in the art to which this invention pertains that it may take many other forms and be of utility in a wide variety of devices and systems.

As is well known the counting system to which we were first exposed as children is the decimal system. However, modern computers are not capable of computing efficiently in a decimal system. Accordingly, computer language and human language are quite different. Normal computer language is termed "binary." For the convenience of the decimally bound human it is often necessary for a computer to convert from binary to decimal or decimal to binary. The present invention may find use in facilitating such conversions.

Additionally the invention may fiind utility in the transmission of alpha numeric signals. More specifically, the invention may be used in conjunction with a serializer and/or deserializer for converting signals from parallel to serial form or serial to parallel form, respectively. That is, in the high-speed transmission of data between a sending and receiving station it is common to register the bits of the signal to be transmitted, send a start of character signal and then signals indicative of the individual bits serially, followed by an end of character signal. The end of character signal is conventionally known as the stop bit. Accordingly, the total number of bits transmitted per character is two more than the number of intelligence bits. Modern systems use various numbers of intelligence bits per character. For example, some use 5, 6, 7 or 8 bits per character. The larger number of bits per character permits the coding of more characters, the use of parity checks and function codes. Therefore, although the transmission time is correspondingly increased (if bit per second rate is constant) when an 8 bit per character code is used, such codes are finding increased use. Accordingly, the invention will be specifically described in an electronic distributor application for the transmission of 8 data bits and the conventional start and stop codes per character.

For this application, and in accordance with the invention it is necessary to provide a counter which responds to successive clock pulses and assumes at least 10 unique conditions. Since an electronic counter is a binary device it is apparent that the counter must have four stages which can provide a maximum count of $2^4$ or 16 unique settings. Three stages would be inadequate as only $2^3$ or 8 unique settings would be available. The fact that it is necessary to provide the ability to count to a number higher than that which is required permits the use of judiciously selected unique settings from among the greater number available. By such selection it is possible to distinguish from among the useful settings with a minimum number of identifying leads. The useful settings can be made to succeed each other without going through the unwanted settings.

Further objects and advantages of the invention as well as an understanding of the principles thereof will be more apparent from consideration of the following specification studied in conjunction with the accompanying drawings wherein:

FIG. 1 is a logic circuit representation of the invention; and FIG. 2 is a tabulation of the condition of the counter after each pulse of a series of pulses.

Before proceeding, a word about the numbering of the elements is in order as an understanding of the numbering will facilitate identification, location and function of the parts. Elements starting with the digit one generally relate to a binary counter located in the upper left of the drawing when it is turned sideways. Elements starting with the digit three generally relate to a series of AND gates which are selectively controlled by the bistable elements of the counter. Elements with a third digit of zero are generally major elements and are distinguished from similar elements by different second digits. Subordinate parts of a major element have an identifying number wherein the first two digits are identical to the first two digits of the major element. For the most part items identified with similar third digits have corresponding functions. The two output leads of the bistable elements are identified with a fourth digit of either one or zero to indicate the binary nature of the output. Each of the four flip-flop circuits 110, 120, 130 and 140 include set and reset gates which have been given identification numbers ending in 1 and 4, respectively. Each set gate (111, 121, 131 and 141) have two inputs which are conditioning and triggering inputs and which have been given identification numbers ending in 2 and 3, respectively. The trigger inputs are capacitively coupled and therefore, as an indication of this fact, all trigger input leads terminate in a short vertical line suggestive of a plate of a capacitor.

Each reset gate (114, 124, 134 and 144) also has a conditioning and triggering input which have been identified with numbers ending in 6 and 5, respectively.

Each bistable flip-flop has two output leads on which a conditioning potential may be placed which is indicative of the current state of the associated flip-flop.

It is believed that the general nature and operation of a flip-flop is too well known to require detailed elaboration herein because the specific flip-flop circuit used is not of the essence. In the discussing flip flops it is customary to refer to them as being set to their "1" state or reset to their "0" state. In conformity with this custom the input gates have been designated set and reset. When a flip-flop is set in response to a trigger pulse applied to a conditioned set gate a 1st and 2nd potential will be applied to 1st and 2nd output leads, respectively. When a flip-flop is reset the potentials will reverse so that the 1st and 2nd potentials are applied to the 2nd and 1st output leads, respectively. Thus each time a flip-flop is set or reset the output signals reverse. However, it must be understood that only the first of a succession of like pulses will affect the flip-flop. That is, once a flip-flop is set any further signals through the set gate will not alter the output; and if the flip-flop is reset any additional signals through the reset gate will not alter the output.

As a matter of convenience it is customary to consider only one of the two output leads and potentials, as it is always known that the other lead is at the other potential. Accordingly, hereafer if a flip-flop has been reset to its "0" state, a first potential will be considered to be applied to the associated output lead designated with a number corresponding to that which identifies the flip-flop and followed by a dash and a "0." In a similar manner a set flip-flop will apply said first potential to the other lead having a designation ending in dash "1." Thus if all flip-flops are reset the same potential will be placed on output leads 110–0, 120–0, 130–0 and 140–0, while if all flip-flops are set the same potential will be placed on output leads 110–1, 120–1, 130–1 and 140–1. Or if some flip-flops are set and some reset the potential will be applied to the appropriate combination of the output leads. In any event, since the flip-flops have only the two possible stable states the same potential will always be applied to some combinations of 4 of the 8 output leads. With the four flip-flops of FIG. 1 a total of 16 possible combinations of application of potential is possible.

As may be seen from FIG. 1 the outputs of some of the flip-flops provide conditioning and/or triggering inputs to other flip-flops. For example, output lead 120–0 of flip-flop 120 can condition set gate 111 of flip-flop 110 and/or trigger set gates 131 or 141.

Depending upon the nature of the circuit design and the type of components used the gates may be made to respond to either positive going or negative going pulses. In this example it will be assumed that the set and reset gates such as gates 131 and 141 will respond to the potential change that occurs on lead 120–0 when flip-flop 120 is changed from its set to its reset condition. In a similar manner all other gates are designed to pass a pulse in response to the application of same sense potential change to the trigger input if the associated conditioning lead is already at the potential the triggering input is approaching.

The counter of FIG. 1 also includes an Auxiliary AND gate which will pass a signal to trigger input lead 113 when the input leads 151 and 152 are at the potential to which reference has been made.

The counter of FIG. 1 is driven in response to successive pulses on lead 160. It may be noted that the pulses applied to lead 160 are applied as trigger inputs to all of the reset gates 114, 124, 134 and 144. However, the associated flip-flops will only be affected if the reset gate is conditioned and if the flip-flop is not already in the reset state.

Having set forth this preliminary detail it will now be shown how the counter of FIG. 1 responds to successive pulses on lead 160. For this purpose it will first be assumed that all of the flip-flops have been reset. Accordingly, all the output leads of the bistable elements, 110, 120, 130 and 140 which have designations ending in "0," i.e. 110–0, 120–0, 130–0 and 140–0; will have conditioning potential applied thereto. Examination of the circuit of FIG. 1 will reveal that the conditioning potential will therefore be applied to several different gates. More specifically, the conditioning potential on lead 110–0 will be applid to reset gate 124. Since flip-flop 120 is already presumed to be reset a pulse on lead 125 will not alter the condition of flip-flop 120. In a similar manner lead 120–0 will apply conditioning potential to set gate 111; lead 130–0 will apply conditioning potential to set gate 144 and lead 140–0 will apply conditioning potential to set gate 131 and gate 150. In response to the first pulse on lead 160 a pulse will be passed through conditioned AND gate 150 to trigger input 113 of conditioned set gate 111 to set flip-flop 110. In response to the setting of flip-flop 110 a potential will be placed on lead 110–1. The pulse applied on lead 160 is also applied to all reset gates 114, etc. However, no conditioning is applied to reset gage 114 and the flip-flops 120, 130 and 140 are already reset. Therefore, the only effect of the first pulse is to set flip-flop 110.

In summary the first pulse set flip-flop 110 while all other flip-flops remained reset. With flip-flop 110 set the set gate 121 of flip-flop 120 is conditioned as with flip-flop 110 set a conditioning potential is applied to output lead 110–1 instead of output lead 110–0.

The second pulse on lead 160 will again pass through AND gate 150 to set gate 111. But since flip-flop 110 is already set this pulse has no effect on flip-flop 110.

The second pulse is also applied as a trigger input to set gate 121 to set flip-flop 120. In response to the setting of flip-flop 120 a conditioning potential will be applied from lead 120–1 to lead 116 and to reset gate 114.

In summary the second pulse set flip-flop 120 while all others remained as they had been.

The third pulse on lead 160 will reset flip-flop 110. With flip-flop 110 reset conditioning potential is applied to reset gate 124 via leads 110–0 and 126. In summary the third pulse reset flip-flop 110 while flip-flop 120 remained set and flip-flops 130 and 140 remained reset.

The fourth pulse will pass through now conditioned reset gate 124 to reset flip-flop 120. The resetting of flip-flop 120 will suddently change its output lead 120–0 to triggering potential and therefore a pulse will also be passed through set gate 131 to set flip-flop 130. Flip-flop 120 is reset prior to the setting of flip-flop 130 since flip-flop 120 had to be reset to provide trigger potential to set flip-flop 130.

In summary the fourth pulse reset flip-flop 120 and then flip-flop 130 was set while flip-flops 110 and 140 remained reset.

It should be observed that at the end of the fourth pulse flip-flops 110 and 120 are both in their initial state. More specifically, flip-flops 110 and 120 have assumed every possible combination of set and reset and now that they have resumed their initial state flip-flop 130 has been set. The following chart which is similar to a portion of FIG. 2 indicates the conditions that obtain at the end of each pulse.

| Pulse | Flip-Flops 110 | 120 | 130 | 140 |
|---|---|---|---|---|
| Initial | Reset | Reset | Reset | Reset |
| 1 | Set | Reset | Reset | Reset |
| 2 | Set | Set | Reset | Reset |
| 3 | Reset | | Reset | Reset |
| 4 | Reset | Reset | Set | Reset |

It may be noted that with respect to flip-flops 110 and 120 only one or the other changes in response to any given pulse. In an ordinary binary counter it is normal for more than one flip-flop element to be changed in response to a single pulse during at least one stage of the counting. It is possible to develop counters comprising more than two flip-flops in which only one flip-flop is changed per pulse. Such codes are known as Gray codes. See for example: "An Analog-to-Digital Converter for Serial Computing Machines," Proc. I.R.E., 41, No. 10, 1462–1465 (October 1953) by Gray, Levonian & Rubinoff. Thus it will be seen that flip-flops 110 and 120 have counted through a Gray code in response to successive pulses. In a like manner it will be seen that flip-flops 130 and 140 will respond in a similar manner but that successive pulses from source 160 will not necessarily initiate any change in flip-flops 130 and 140. Furthermore, as already indicated one of the flip-flops in the pair 110 and 120 and another in the pair 130 and 140 may change at the same time. Therefore, although the individual pairs advance in a Gray code, the four flip-flops 110, 120, 130 and 140 considered as a unit do not advance in a Gray code.

From the foregoing it will be evident that the 5th, 6th, 7th and 8th pulses from source 160 will cause flip-flops 110 and 120 to advance through the same cycle as the 1st, 2nd, 3rd and 4th pulses did.

It should now be observed that after the 4th pulse which sets flip-flop 130 a conditioning potential was placed on the 130–1 lead thereof to condition the set gate 141 of flip-flop 140. Furthermore, the trigger input 143 of the last named set gate is connected to the output lead 120–0 of flip-flop 120. Therefore, the next time flip-flop 120 is set the output lead thereof will change potential in the correct sense to trigger set gate 141 of flip-flop 140. Accordingly, in response to the 8th pulse from source 160 flip-flop 120 will be reset, just as it was in response to the 4th pulse, and immediately thereafter flip-flop 140 will be set since it is conditioned from set flip-flop 130.

The following table indicates the conditions that prevail at the end of each of the pulses in the 2nd group of four pulses.

| Pulse | Flip-Flops 110 | 120 | 130 | 140 |
|---|---|---|---|---|
| 4 | Reset | Reset | Set | Reset |
| 5 | Set | | Set | Reset |
| 6 | Set | Set | Set | Reset |
| 7 | Reset | Set | Set | Reset |
| 8 | Reset | Reset | Set | Set |

From the pattern as thus far developed it would be logical to assume that the 9th pulse would cause flip-flop 110 to be set. However, in the illustrated embodiment of the invention a total count of 10 unique positions is required and it is expedient to modify the count at this stage.

With flip-flop 140 set there is no conditioning potential on its output lead 140–0 and therefore AND gate 150 is not enabled to pass a pulse from source 160. Therefore, although set gate 111 of flip-flop 110 is conditioned the 9th pulse will not be enabled to pass through AND gate 150 and set flip-flop 110. However, flip-flop 140 being set does cause conditioning potential to be placed on lead 140–1 to condition reset gate 134 of flip-flop 130. Accordingly, in response to the 9th pulse flip-flop 130 will be reset.

The 10th pulse will be unable to set flip-flop 110 for the same reasons as given above with respect to the 9th pulse. However, with flip-flop 130 reset a conditioning potential is placed on lead 130–0 to condition reset gate 144 of flip-flop 140.

Accordingly, in response to the 10th pulse flip-flop 140 will be reset thereby resulting in the assumed initial condition with all flip-flops in their reset state.

As stated at the outside of this specification the invention described herein may find utility as an electronic distributor. A feature of the invention resides in the fact that a plurality of control gates may be enabled seriatim by the counter with a minimum number of control leads between the counter and the control gates.

In the illustrated example the counter is designed to count to ten; or more specifically to advance step by step through ten unique settings. In an ordinary counter it would be necessary to test the state of all (or at least most) of the bistable elements of the counter in order to uniquely determine the setting of the counter, whereas in the instant illustration all ten of the steps may be uniquely identified by only two signals. This may be most readily understood by examination of the table of FIG. 2 which summarizes the set and reset conditions of flip-flops 110, 120, 130 and 140 at the end of each of the ten successive pulses from source 160.

Consider now the first pulse which caused flip-flop 110 to be set. Prior to the pulse flip-flop 130 was reset and as a result of the pulse flip-flop 110 was set which resulted in the 110–1 output lead thereof having its potential altered in a sense to provide a trigger pulse. Examination of FIG. 2 will reveal that there are no other times when flip-flop 110 is shifted to the set state while flip-flop 130 was in the reset state.

More specifically the next time flip-flop 110 is set it will be noted that flip-flop 130 is already in the set condition. Accordingly, an AND gate may be uniquely opened in response to the first pulse only, by conditioning the AND gate from the 130–0 output lead of flip-flop 130 and triggering the same AND gate from the 110–1 output lead of flip-flop 110. The leads and connections required for opening successive AND gates in response to successive pulses are tabulated in FIG. 2. Under the column headed C, for conditioning, and T, for trigger, are listed the connections required for conditioning and triggering respectively, the individual AND gates corresponding to each of ten unique settings of the counter. For example, for the first pulse the 130–0 indicates that a conditioning lead is required from flip-flop 130 in the reset condition. The trigger lead is from the 110–1 output of flip-flop 110.

As another example the 8th pulse will cause the unique opening of a gate 380 which is conditioned from the 130–1 output of flip-flop 130 and triggered by the 120–0 output of flip-flop 120.

Careful examination of the chart of FIG. 2 will reveal that each of the ten pulses sets the counter of FIG. 1 to a unique position and that the particular unique position that is obtained in response to a given pulse may be uniquely defined by the two output leads tabulated.

As previously set forth the invention may find utility as an electronic distributor. FIG. 1 illustrates the manner in which the output leads of flip-flops 110, 120, 130 and 140 may be connected to ten AND gates for the sequential triggering thereof. More specifically, the gates 310 to 390 and 300 will each be uniquely triggered into conduction only once per counting cycle of the counter of FIG. 1. For convenience in circuit analysis the conditioning lead is drawn as the top input of each AND gate and the triggering lead is the next one down.

If the AND gates of FIG. 1 are used to deserialize signals the data bus on which the signals appear in time sequence could be coupled as a third and common input to all the AND gates. Then with proper synchronization the trigger pulses could be generated near the midpoint of each signal bit thereby gating a sample of the signal input through a selected AND gate. The output signal of the gates can be used in any manner well known to those familiar with the art and techniques.

If the AND gates of FIG. 1 are used to serialize data received in parallel all the outputs of the AND gates would be connected together and the data bits individually coupled to selected ones of the gates. In this manner the AND gates could be sequentially triggered and caused to gate out a sample of a selected one of the inputs.

Other uses will be apparent to those trained in these arts.

While there has been shown and described what is considered at present to be the preferred embodiment of the invention, modifications thereto will readily occur to those skilled in the art to which this teaching pertains. It is not desired, therefore, that the invention be limited to the embodiment shown and described, and it is intended to cover in the appended claims all such modifications as fall within the true spirit and scope of the invention.

What is claimed is:

1. In a pulse responsive counter, first and second pairs of bistable elements, each of said elements having a pair of output terminals, a pulse source, first and second pairs of input terminals associated with each of said bistable elements to provide access means for setting their respective elements to their first and second bistable states, first circuit means interconnecting selected ones of said input terminals of said elements to said pulse source for directing successive pulses from said source to selected ones of said input terminals so that said first pair of elements is advanced step-by-step from an initial setting through successive stages of a Gray code cycle and back to the initial setting thereof in response to successive pulses from said pulse source, second circuit means interconnecting a selected output terminal of said first pair of elements with selected input terminals of said second pair of elements for directing signals from said first pair of elements to said second pair of elements so that said second pair of elements is advanced from an initial setting to the first stage of a Gray code cycle in response to the pulse from said pulse source which returned said first pair of elements to their initial setting, said first pair of elements being cycled through another Gray code cycle in response to successive pulses from said pulse source, said second circuit means being effective to direct a signal from said first pair of elements to said second pair of elements so that said second pair of elements is advanced from said first stage to the second stage of a Gray code in response to the pulse from said pulse source which returned said first pair of elements to their initial setting for the second time, and a utilization network, to which said output terminals are coupled, for providing an indication of the instantaneous state of each of said elements.

2. The combination as set forth in claim 1 and including third circuit means interconnecting a selected output terminal of said second pair of elements with an input terminal of said first pair of elements so that in response to said second pair of elements being advanced to said second Gray code stage successive pulses from said pulse source are effective for advancing said second pair of elements to a third Gray code stage and to its initial stage.

3. The combination as set forth in claim 2 wherein said third circuit means includes gate means for inhibiting the further cycling of said first pair of elements after they have been advanced through two Gray code cycles.

4. The combination as set forth in claim 1 wherein said pairs of input terminals each comprise one conditioning terminal and one triggering terminal, and wherein a given one of said elements is adjusted to a selected one of its first and second bistable states in response to a pulse on one of the triggering terminals of its said first and second pair of input terminals, only when the conditioning terminal associated with the pulsed triggering terminal is at a given predetermined potential.

5. The combination as set forth in claim 4 wherein said utilization network includes a plurality of gates with each gate having a gate conditioning and a gate triggering input, first connecting means for connecting a first and second one of the output terminals from said second pair of elements to the said gate conditioning input of a first and second plurality of said gates, respectively, and second connecting means individually connecting each of said gate triggering inputs of said first plurality of gates to a selected one of the output terminals from one of said elements of said first pair of elements for controlling the condition of the said connected gate in accordance with the bistable state of the element connected via said second connecting means.

6. The combination as set forth in claim 5 wherein the individual leads connected to successive ones of the gate triggering inputs in said first plurality of gates are also connected to successive ones of the gate triggering inputs in said second plurality of gates.

7. The combination as set forth in claim 6 and including one or more additional gates each having a gate conditioning and a gate triggering input, each of said additional gates controlled by connection to a pair of output terminals from said elements with one of said connections providing a signal to said gate conditioning input and the other one providing a signal to said gate triggering input.

References Cited

UNITED STATES PATENTS

| | | | |
|---|---|---|---|
| 2,632,058 | 3/1953 | Gray | 179—15 |
| 3,200,339 | 8/1965 | Gorlin | 328—46 |
| 3,349,332 | 10/1967 | Bleickardt | 328—42 |
| 3,426,180 | 2/1969 | Smith | 235—92 |

MAYNARD R. WILBUR, Primary Examiner

J. M. THESZ, Jr., Assistant Examiner

U.S. Cl. X.R.

340—347